United States Patent
Burbano et al.

(10) Patent No.: US 10,749,717 B2
(45) Date of Patent: Aug. 18, 2020

(54) DEMODULATOR FOR PULSE-WIDTH MODULATED CLOCK SIGNALS

(71) Applicant: ANALOG DEVICES, INC., Norwood, MA (US)

(72) Inventors: Oscar Sebastian Burbano, Greensboro, NC (US); Reuben P. Nelson, Colfax, NC (US)

(73) Assignee: Analog Devices, Inc., Norwood, MA (US)

( * ) Notice: Subject to any disclaimer, the term of this patent is extended or adjusted under 35 U.S.C. 154(b) by 238 days.

(21) Appl. No.: 15/637,858

(22) Filed: Jun. 29, 2017

(65) Prior Publication Data
US 2019/0007243 A1  Jan. 3, 2019

(51) Int. Cl.
| | | |
|---|---|---|
| H04L 25/49 | (2006.01) | |
| H04L 7/00 | (2006.01) | |
| G06F 1/12 | (2006.01) | |
| H03D 3/22 | (2006.01) | |
| H03K 7/04 | (2006.01) | |
| H03K 9/08 | (2006.01) | |
| H04L 27/233 | (2006.01) | |
| H04L 27/34 | (2006.01) | |

(52) U.S. Cl.
CPC .......... H04L 25/4902 (2013.01); G06F 1/12 (2013.01); H03D 3/22 (2013.01); H03K 7/04 (2013.01); H03K 9/08 (2013.01); H04L 7/0008 (2013.01); H04L 27/2331 (2013.01); H04L 27/34 (2013.01)

(58) Field of Classification Search
USPC ................. 375/340, 316, 317; 329/311, 313
See application file for complete search history.

(56) References Cited

U.S. PATENT DOCUMENTS

2004/0136402 A1 * 7/2004 Ozawa ................ H04L 25/4902
                                                    370/516
2015/0109531 A1 * 4/2015 Nishio ..................... G06F 5/06
                                                    348/537

FOREIGN PATENT DOCUMENTS

| JP | S57 6423 | 1/1982 |
|---|---|---|
| JP | S57 10567 | 1/1982 |

OTHER PUBLICATIONS

Extended European Search Report received in EP18179649.1, dated Oct. 19, 2018.

* cited by examiner

Primary Examiner — Arnold M Kinkead
(74) Attorney, Agent, or Firm — Knobbe, Martens, Olson and Bear, LLP (57) ABSTRACT

A demodulator for pulse-width modulated clock signals is disclosed. In one aspect, the demodulator includes an edge detector configured to detect transitions in a reference clock and output a signal indicative of timing of the detected transitions. The demodulator may also include a modulation detection circuit configured to identify modulation events of at least one pulse-width modulated pulse in the reference clock based on the signal output from the edge detector and output a signal indicative of the at least one pulse-width modulated pulse modulation event being identified. The demodulator may further include a retiming circuit configured to generate an output clock synchronized with the at least one pulse-width modulated pulse modulation event based on the signal output from the modulation detection circuit.

20 Claims, 9 Drawing Sheets

DEMODULATOR FOR PULSE-WIDTH MODULATED CLOCK SIGNALS

BACKGROUND

Field

The described technology generally relates to a demodulator, and more particularly, to a demodulator configured to demodulate pulse-width modulated clock signals for use in synchronizing a plurality of semiconductor integrated circuit (IC) chips.

Description of the Related Technology

Certain electronic systems may be formed using a plurality of IC chips combined to provide desired functionalities. Each IC chip may receive a reference clock signal to control the timing of the individual IC chips. For certain applications, the IC chips are synchronized to function properly.

SUMMARY

The systems, methods and devices of this disclosure each have several innovative aspects, no single one of which is solely responsible for the desirable attributes disclosed herein.

In one aspect, there is provided a clock demodulation circuit for synchronizing an output clock with a pulse-modulated reference clock. The demodulation circuit may include: an edge detector configured to detect transitions in the reference clock and output a signal indicative of timing of the detected transitions; a modulation detection circuit configured to identify modulation events of at least one pulse-width modulated pulse in the reference clock based on the signal output from the edge detector and output a signal indicative of the at least one pulse-width modulated pulse modulation event being identified; and a retiming circuit configured to generate an output clock synchronized with the at least one pulse-width modulated pulse modulation event based on the signal output from the modulation detection circuit.

In another aspect, there is provided a system for synchronizing clock signals between a plurality of circuits including: a reference clock generator configured to generate a reference clock having at least one pulse-width modulated pulse; a plurality of circuits, each circuit comprising a demodulation circuit, comprising: an edge detector configured to detect transitions in the reference clock and output a signal indicative of timing of the detected transitions; a modulation detection circuit configured to: i) identify modulation events of at least one pulse-width modulated pulse based on the signal output from the edge detector and ii) output a signal indicative of the modulation event of at least one pulse-width modulated pulse being identified; and a retiming circuit configured to generate an output clock synchronized with the modulation event of at least one pulse-width modulated pulse based on the signal output from the modulation detection circuit.

In yet another aspect, there is provided a method of demodulating a reference clock including: detecting a transition in the reference clock, the reference clock having at least one pulse-width modulated pulse; identifying the at least one pulse-width modulated pulse based on the transition in the reference clock; and generating an output clock synchronized with the at least one pulse-width modulated pulse based on the identified at least one pulse-width modulated pulse.

BRIEF DESCRIPTION OF THE DRAWINGS

These drawings and the associated description herein are provided to illustrate specific embodiments and are not intended to be limiting.

DETAILED DESCRIPTION

The following detailed description of certain embodiments presents various descriptions of specific embodiments of the disclosure. However, other embodiments can be implemented in a multitude of different ways as defined and covered by the claims. In this description, reference is made to the drawings where like reference numerals can indicate identical or functionally similar elements. In the drawings, certain embodiments are illustrated with representative block diagrams. These block diagrams are simplified representations of the embodiments in which certain elements not directly related to the described embodiments are not illustrated.

Figure 1:
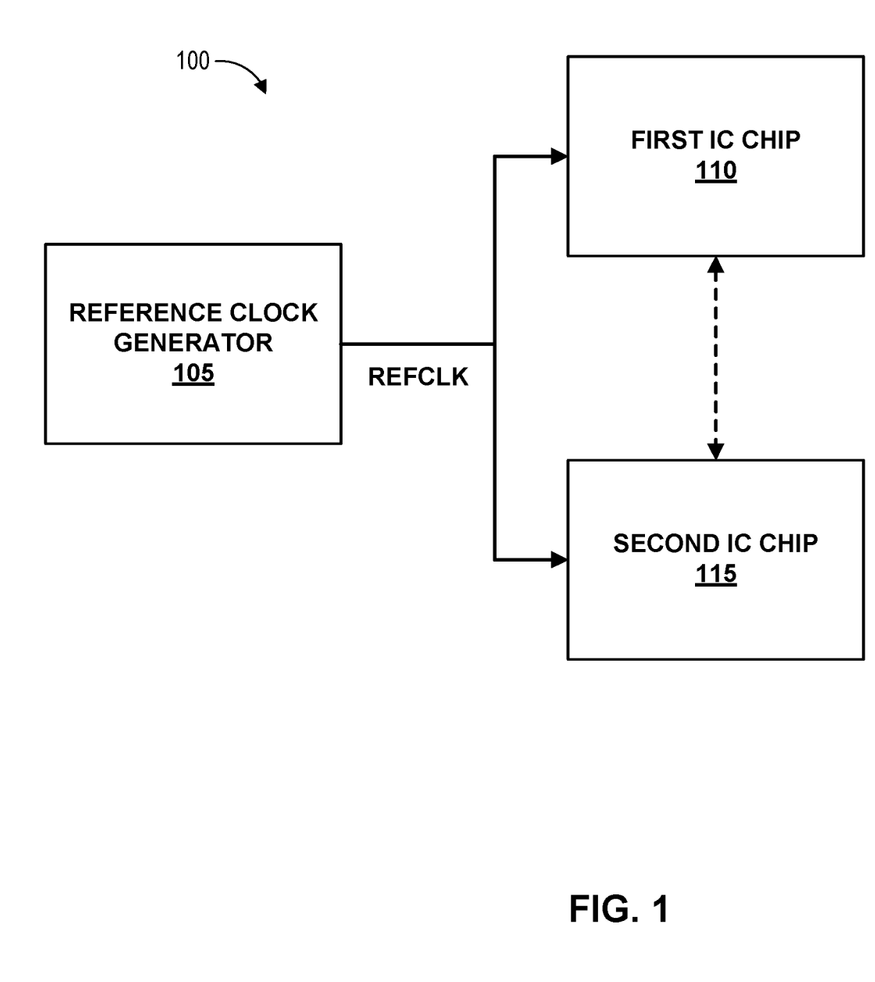
FIG. 1 is a block diagram illustrating one example of an electronic system including integrated circuits (ICs) in accordance with aspects of this disclosure.

Integrated circuit (IC) system design may involve electrically connecting a plurality of IC chips together in order to achieve a desired function. Examples of IC chips which may be used to in electronic system design include analog-to-digital converters (ADCs), digital-to-analog converters (DACs), transceivers, etc. FIG. 1 is a block diagram illustrating one example of an electronic system including integrated circuits (ICs) in accordance with aspects of this disclosure. The system 100 of FIG. 1 includes a reference clock generator 105, a first IC chip 110, and a second IC chip 115. The reference clock generator 105 may be configured to generate a reference clock REFCLK which is supplied to each of the first and second IC chips 110 and 115. As discussed in greater detail below, each of the first and second IC chips 110 and 115 may use the reference clock REFCLK in order to generate its own internal, lower frequency clock, which may be used to time various actions of various electronic components used to achieve the respective functionalities of the chips 110 and 115.

As indicated by the dashed line in FIG. 1, the first and second IC chips 110 and 115 may optionally communicate with each other. The system 100 of FIG. 1 is merely an example and the described technology is not limited to the illustrated configuration. For example, in certain embodiments, the system 100 may include additional IC chips, some of which may also receive the reference clock REFCLK from the reference clock generator 105 and/or communicate with one or more of the first and second IC chips 110 and 115.

As described briefly above, each of the IC chips 110 and 115 may generate an internal clock signal used as an input for component(s) included within the chips. In certain implementations, the design of the system 100 may rely on coordinated functionality between the two IC chips 110 and 115. In these implementations, in order for the various functions of the first and second IC chips 110 and 115 to operate correctly, the internal clocks are synchronized. As used herein, the synchronization of IC chips generally refers to the internal clocks used by each of the IC chips 110 and 115 having periodic transitions that occur at substantially the same time.

For certain applications, it may be important that at least some of the IC chips 110 and 115 are synchronized with each other to facilitate communication therebetween. However, there may be other reasons for synchronizing IC chips, such as to account for temperature variations between the IC chips. Additionally, temperature changes may affect how IC chips 110 and 115 are able to detect a SYSREF signal, which may cause misalignment between output clocks generated on the individual IC chips 110 and 115.

An example of how the synchronization of IC chips 110 and 115 can be used for communication between the IC chips 110 and 115 and/or with other synchronized systems will now be described. Data transmission between IC chips 110 and 115 may be performed at or within regularly occurring time periods, also referred to as frames. Thus, the communication between IC chips may have a defined frame rate based on the period of the frames used for communication. Each frame may include an integer number of clock periods of a reference clock REFCLK.

Each of the IC chips 110 and 115 can be properly synchronized with respect to the reference clock such that the frames used for communication line up (e.g., the start and end of each frame occur at substantially the same time). For example, each IC chip 110 and 115 can identify the same transition in the reference clock on which to base the start of a given frame. If two IC chips 110 and 115 identify different reference clock transitions, the frames will be offset from each other, which may lead to errors in communication between the IC chips 110 and 115.

Additionally, the initial power up sequences for each of the IC chips 110 and 115 may be independent of each other. Thus, the time at which each IC chip 110 and 115 begins to detect the reference clock REFCLK may be considered random. That is, the power up sequence timing for the IC chips 110 and 115 for a given system is asynchronous. Accordingly, it is desirable to provide a method for synchronizing the internal clocks used by a plurality of IC chips 110 and 115 to each other using a reference clock REFCLK.

One technique for synchronizing IC chips 110 and 115 involves the use of additional clock synchronization signal(s), such as a sync clock (SYSREF) signal or a pulse(s)-per-second (PPS) signal. SYSREF and PPS signals are commonly used in time-of-day systems, such as global positioning system (GPS) timing, IEEE-1588 Precision Time Protocol (PTP), and/or chip-to-chip synchronization systems, such as JESD204b. However, there are a number of drawbacks to the use of additional clock synchronization signals. For example, transmission of an additional clock synchronization signal can be direct-current (DC) coupled and/or implemented as a phase-locked-loop (PLL), which typically has a relatively low loop bandwidth. Further, the use of a PLL and/or additional clock synchronization signal(s) may require additional hardware, such as electrical components forming the PLL and signal lines used to transmit the additional synchronization signal(s). These additional components and/or lines may be hardware intensive and/or expensive in terms of the area and/or power requirements for a particular implementation. Additionally, as the frequency of the reference clock REFCLK increases, the retiming of the reference clock REFCLK using a SYSREF signal becomes more difficult. When the IC chips 110 and 115 are located on different boards using connectors, additional hardware, such as amplifiers, may be used to route signals therebetween.

In some implementations, a PPS signal can be paired with a second, synchronous clock having a higher clock rate in place of using a PLL; however, the addition of another synchronous clock adds another signal to be transmitted and skew controlled.

Aspects of this disclosure address one or more of the above problem(s) by embedding a synchronization signal on the reference clock REFCLK. For example, in certain implementations, the embedding of a synchronization signal on the reference clock REFCLK may include the modulation of the width of one or more pulses of the reference clock REFCLK. In general, information may be signaled on a carrier signal via pulse-width modulation (also referred to as duty-cycle modulation). Accordingly, in certain implementations, pulse(s) of the reference clock REFCLK may be pulse-width modulated to signal one of the transitions in the reference clock REFCLK as a synchronization pulse. Each of the first and second IC chips 110 and 115 may thus be configured to detect a modulation event (e.g., one or more pulse-width modulated pulses) and select a transition in the reference clock. The selected transition may be used by the first and second IC chips 110 and 115 to generate an output clock (also referred to as a demodulation clock) such that the output clock is synchronized to the output clock of the other IC chips 110 and 115.

Figure 2:
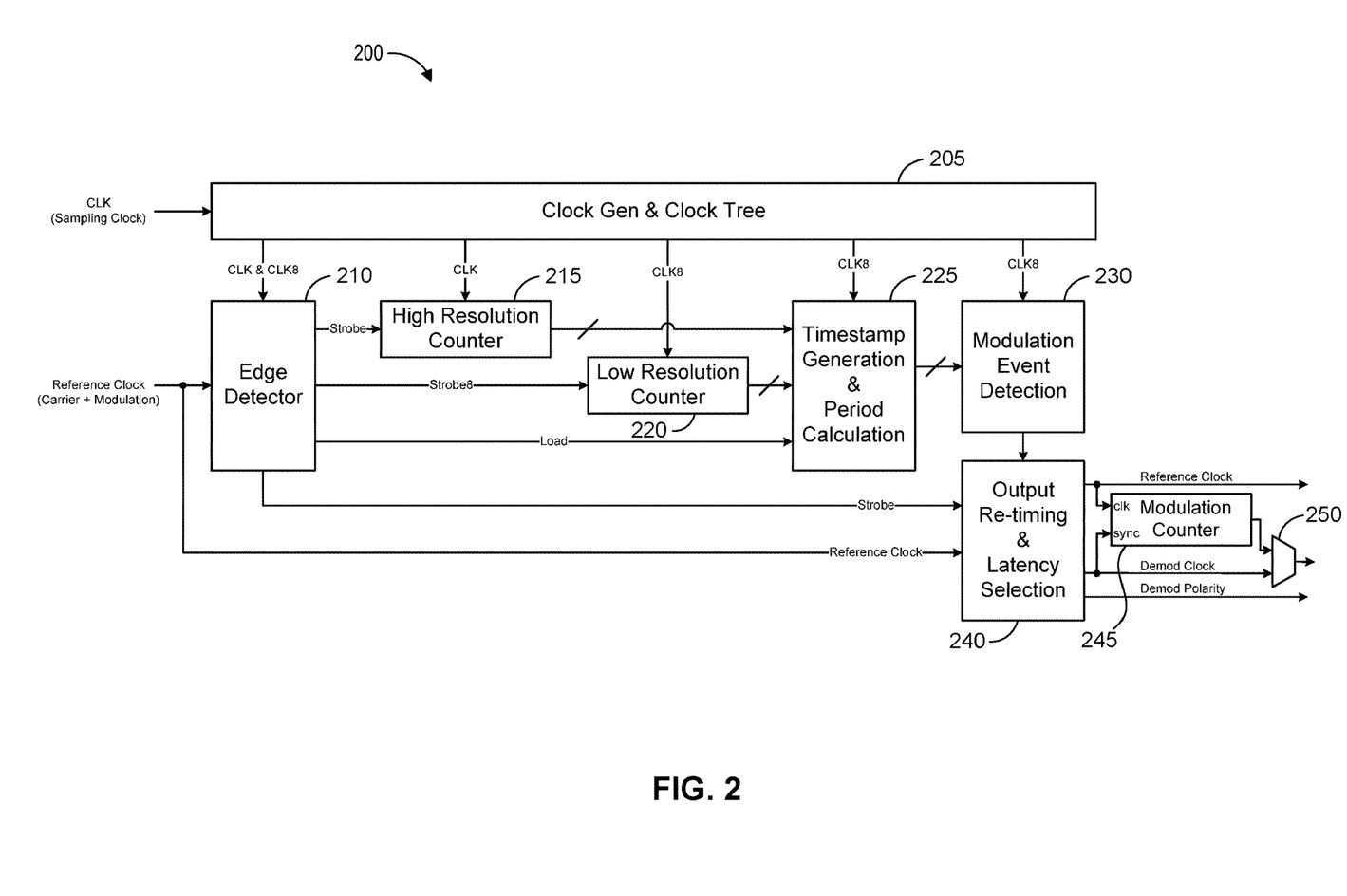
FIG. 2 is a block diagram illustrating one embodiment of a demodulator which may be used to detect modulation event(s) in accordance with aspects of this disclosure.

In order to detect modulation events, each of the IC chips 110 and 115 in the system 100 may include a demodulator. FIG. 2 is a block diagram illustrating one embodiment of a demodulator which may be used to detect modulation event(s) in accordance with aspects of this disclosure.

Referring to FIG. 2, the demodulator 200 may include a clock generator and clock tree 205 (also referred to as a clock generator), an edge detector 210, a high resolution counter 215, a low resolution counter 220, a timestamp generator and period calculator 225, a modulation event detector 230 (also referred to as a modulation detection circuit), an output re-timing and latency selection circuit 240 (also referred to as a retiming circuit), a modulation counter 245, and a multiplexor 250. However, FIG. 2 is merely an embodiment of the disclosed technology. One or more of the illustrated blocks may be modified and/or removed without necessarily departing from this disclosure.

In certain embodiments, as shown in FIG. 2, the demodulator may be implemented using digital components. This may improve the portability of the demodulator between IC chip 110 and 115 having different functionality since the code defining the digital circuitry (e.g., Verilog code) may be easily shared between IC chip 110 and 115 designers. Additionally, a digital implementation may be smaller than a comparative analog implementation and may also be more robust in terms of clock synchronization.

In the embodiment of FIG. 2, the demodulator 200 receives a sampling clock CLK and a reference clock REFCLK. For example, the demodulator 200 may have a sampling clock input (not illustrated) configured to receive reference clock REFCLK is received from a reference clock generator, such as the reference clock generator 105 of FIG. 1. In certain embodiments, the sampling clock CLK may be generated by the IC chip 110 or 115 outside of the demodulator 200 or may be generated within the demodulator 200 (not illustrated). The clock generator 205 may receive the sampling clock CLK and generate a low frequency sampling clock CLK8 and may provide the sampling clock CLK and the low frequency sampling clock CLK8 to a number of the circuits included in the demodulator 200. In one implementation, the low frequency sampling clock CLK8 has a frequency that is $\frac{1}{8}^{th}$ of the frequency of the sampling clock CLK. However, this is only on implementation and the low frequency sampling clock CLK8 may have a frequency that is any other fraction of the sampling clock CLK.

The clock generator 205 may provide the sampling clock CLK to the edge detector 210 and the high resolution counter 215. The clock generator 205 may also provide the low frequency sampling clock CLK8 to the edge detector 210, the low resolution counter 220, and the timestamp generator and period calculator 225.

The edge detector 210 may receive the reference clock REFCLK, the sampling clock CLK, and the low frequency sampling clock CLK8. The edge detector 210 may be configured to detect transitions in the reference clock REFCLK and output a signal indicative of timing of the detected transitions. For example, the edge detector 210 may identify transitions in the reference clock REFCLK by sampling the reference clock REFCLK at a rate defined by the sampling clock CLK. Accordingly, the sampling clock CLK may have a frequency that is higher than that of the reference clock REFCLK. In one implementation, the sampling clock CLK may have a frequency that greater than or equal to the Nyquist frequency of the reference clock REFCLK. However, in certain implementations, the sampling clock CLK may have a frequency that is substantially greater than the Nyquist frequency of the reference clock REFCLK so that the edge detector 210 can oversample the reference clock REFCLK at a rate defined by the sampling clock CLK. In certain implementations, the sampling clock CLK may be asynchronous with the reference clock REFCLK.

The edge detector 210 may output one or more signals indicative of the timing of the transitions (also referred to as edges) in the reference clock REFCLK. In the embodiment of FIG. 2, the edge detector 210 may output a first strobe signal Strobe and a second strobe signal Strobe8, each being indicative of a falling-edge transition in the reference clock REFCLK. However, in other embodiments, the edge detector 210 may output one or more strobe signals indicative of a rising-edge transition or rising- and falling-edge transitions. The first strobe signal Strobe may be indicative of the timing of a detected transition in the reference clock REFCLK when sampled at the rate of the sampling clock CLK and the second strobe signal Strobe8 may be indicative of the timing of a detected transition in the reference clock REFCLK when sampled at the rate of the low frequency sampling clock CLK8. The edge detector 210 may also generate a load clock Load that is a lower frequency clock generated based on low frequency sampling clock CLK8. Load clock Load may be used by timestamp generator 225 to load the strobed count values from counters 215 and 220 as a trigger for generating timestamps.

The high resolution counter 215 receives the sampling clock CLK and the first strobe signal Strobe. Based on the sampling clock CLK and the first strobe signal Strobe, the high resolution counter 215 generates an indication of the timing of the detected transition in the reference clock REFCLK at the resolution of the sampling clock CLK. Similarly, the low resolution counter 220 receives the low frequency sampling clock CLK8 and the second strobe signal Strobe8. Based on the low frequency sampling clock CLK8 and the second strobe signal Strobe8, the low resolution counter 220 generates an indication of the timing of the detected transition in the reference clock REFCLK at the resolution of the low frequency sampling clock CLK8.

Each of the high resolution counter 215 and the low resolution counter 220 may be implemented as a counter that increments a stored count value based on the received sampling clock CLK or low frequency sampling clock CLK8. The value stored in the counter may be latched in response to the received strobe signal Strobe or Strobe8 and the latched value may be provided as to the timestamp generator and period calculator 225 which may be interpreted by the timestamp generator and period calculator 225 as a timestamp of the edge transition in the reference clock REFCLK. In the embodiment of FIG. 2, the output from the low resolution counter 220 may be representative of the most significant values of the timestamp, which the output from the high resolution counter 225 may be representative of the least significant values of the timestamp.

Although the embodiment of FIG. 2 includes a high resolution counter 215 and the low resolution counter 220, other embodiments may include only a single counter (not illustrated). In these embodiments, the demodulator 200 may also omit the clock generator 205 and all of the components of the demodulator 200 may be run at the sampling clock CLK frequency.

Based on consecutive timestamps representative of the timing of the transitions in the reference clock REFCLK, the timestamp generator and period calculator 225 may calculate the period of each pulse in the reference clock REFCLK.

The modulation event detector 230 may be configured to identify modulation events of at least one pulse-width modulated pulse in the reference clock. The identification of modulation events may be based on the signal output from the edge detector (e.g., received at the modulation event detector 230 via the high and low resolution detectors 215 and 220 and the timestamp generator and period calculator 225). The modulation event detector 230 may also be configured to output a signal indicative of the at least one pulse-width modulated pulse modulation event being identified. For example, the modulation event detector 230 may compare the periods of consecutive pulses to detect modulation events in the REFCLK. In certain implementations, when the lengths of consecutive periods are different, the modulation event detector 230 may determine that a modulation event has occurred. However, there are a number of different modulation events that may be detected by the modulation event detector. Examples of the detectable modulation events and techniques that may be used to detect the modulation events will be described in greater detail below.

Although the above example identifies modulation event based on the timing of falling edges, this disclosure is not so limited. For example, in certain implementations, the period of a given pulse may be calculated based on the time difference between two successive rising edges. In another implementation, the period for a given pulse may be calculated based on timestamps associated with both rising edges and falling edges (e.g., the modulation event detector 230 may be able to detect both low period length and high period length).

The output re-timing and latency selection circuit 240 receives the reference clock REFCLK, first strobe signal Strobe, and the indication of a modulation event and generates an output clock Demod Clock. The output re-timing and latency selection circuit 240 may be configured to generate the output clock Demod Clock to be synchronized with the at least one pulse-width modulated pulse modulation event based on the signal output from the modulation event detector 230. For example, the output clock Demod Clock may be timed to a transition in the reference clock REFCLK signaled by the modulation event. Thus, the output clock Demod Clock can be synchronized to another output clock Demod Clock generated by a similar demodulator 200 located in another IC chip 110 or 115. In certain embodiments, the output re-timing and latency selection circuit 240 may also output the reference clock REFCLK and a demodulation polarity Demod Polarity.

As shown in FIG. 2, the demodulator 200 may also include the modulation counter 245, the output of which may be selected using multiplexor 250. The modulation counter 245 may receive the reference clock REFCLK as a clock input and the output clock Demod Clock as a synchronization input. When the modulation counter 245 is enabled, the modulation counter 245 will automatically synchronize itself to the output clock Demod Clock received from the output re-timing and latency selection circuit 240. For example, the modulation counter 245 may include a counter circuit that counts the number of periods of the reference clock REFCLK for a single period in the output clock Demod Clock.

In certain implementations, the reference clock REFCLK may not continuously generate modulation events (e.g., pulse-width modulated synchronization pulses). For example, the modulation events may be discontinued to avoid the generation of noise and/or spurs from the modulation events. In these implementations, the modulation counter 245 may be activated to continue the generation of a Demod Clock output once the reference clock REFCLK modulation events have been discontinued. In certain embodiments, the reference clock REFCLK modulation events will be discontinued after a short burst of modulated pulses (e.g., a plurality of consecutive modulated pulses, which in one embodiment may include at least 5 modulated pulses). After detecting the modulation events from the burst of modulated pulses, the modulation counter 245 may synchronize and begin generation of a continuous Demod Clock output. The modulation counter 245 may control the selection of the multiplexor 250 to generate a Demod Clock output either directly from the output re-timing and latency selection block 240 or from the modulation counter 245.

Figure 3A:
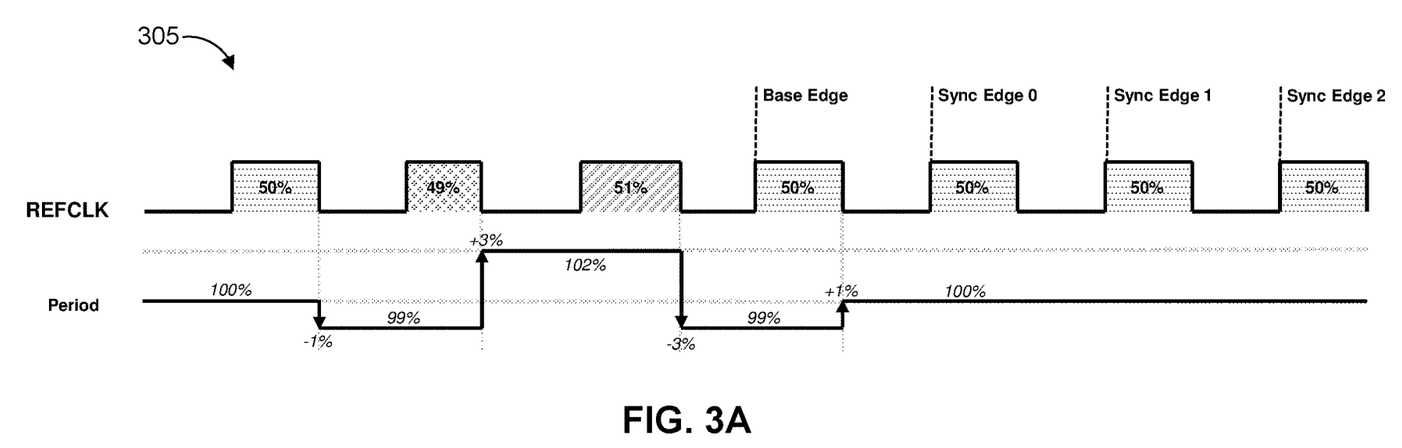
FIGS. 3A-3D provide a number of example reference clocks including a modulation event detectable by the demodulator of FIG. 2.
Figure 3B:
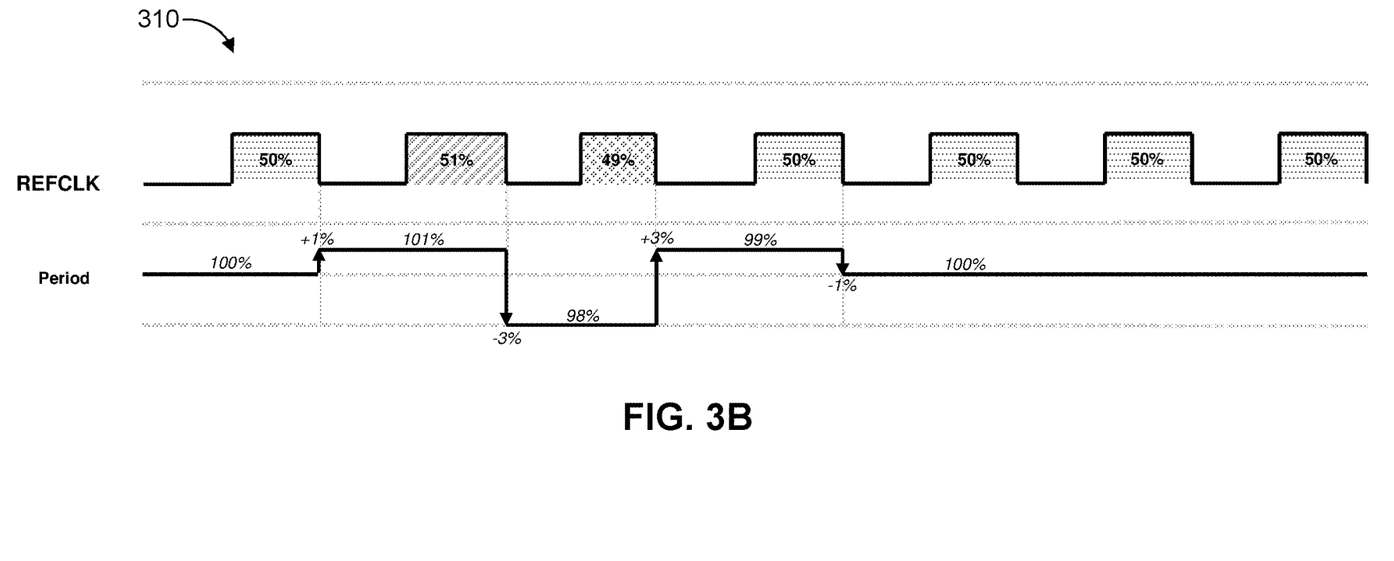
Figure 3C:
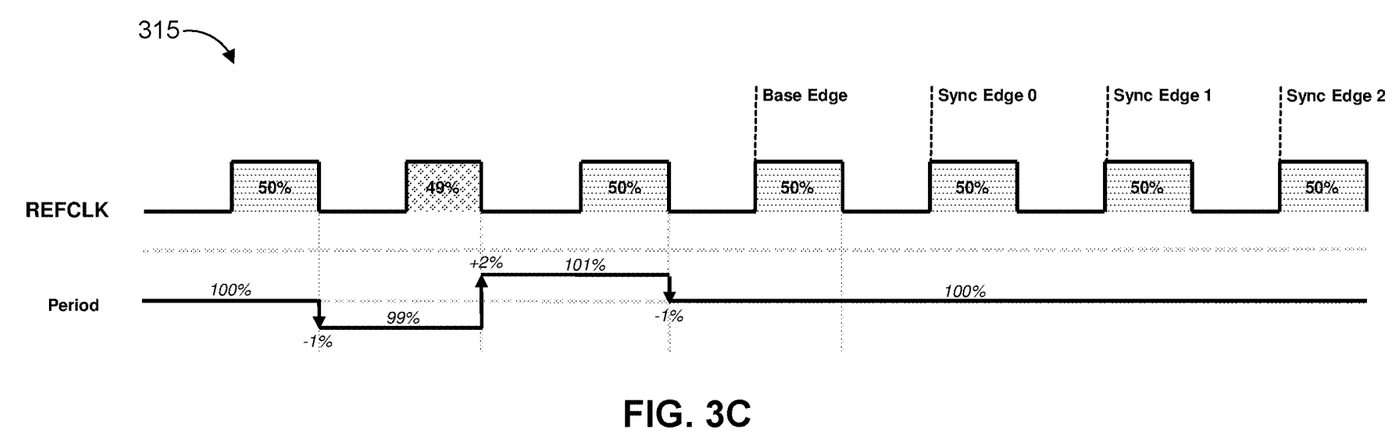
Figure 3D:
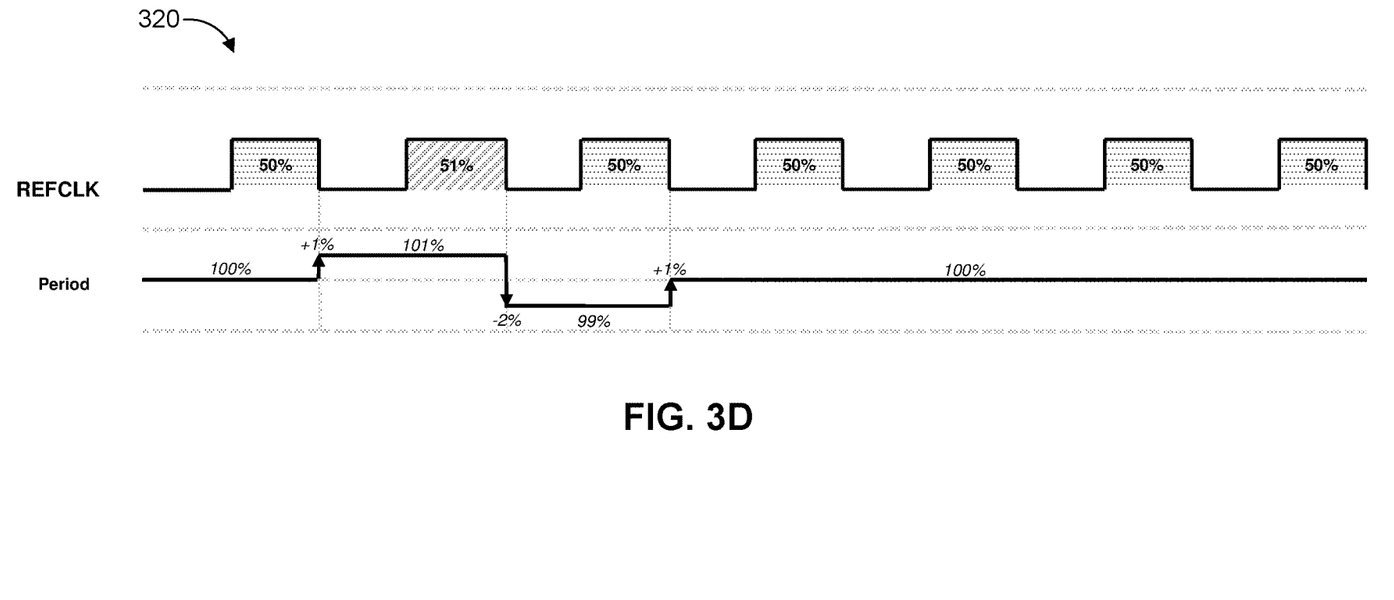

FIGS. 3A-3D provide a number of example reference clocks including a modulation event detectable by the demodulator of FIG. 2. In particular, FIGS. 3A and 3B illustrate DC balanced modulation events, while FIGS. 3C and 3D illustrate unbalanced modulation events. As used herein a DC balanced modulation event may generally refer to two consecutive modulated pulses, where one of the two consecutive modulated pulses has a low duty-cycle and the other of the two consecutive modulated pulses having a high duty-cycle and where the change in the length of the period for each of the consecutive pulse is substantially the same.

In each of FIGS. 3A-3D, a reference clock REFCLK and the period lengths for each pulse in the reference clock CLK are illustrated. In the examples described herein, the timing of the rising edges of the reference clock REFCLK are unchanged, while only the falling edge timing is changed (e.g., only the timing of falling edges of a modulation event are modulated). This may simplify the design for the demodulator 200. However, this disclosure is not limited thereto and may also include the modulation and detection of modulation events in which the timing of a rising edge is altered.

The modulation event 305 of FIG. 3A illustrates a low-to-high (also referred to as lo-hi) modulation event. For example, prior to the modulation event, the period of a pulse in the reference clock REFCLK is 100% of the unmodulated period (e.g., the period of the carrier clock signal). Thereafter, the falling edge of a pulse is reduced, for example, to 49% of the entire pulse period, resulting in an overall modulated pulse period length of 99%. The difference between the period of this pulse and the previous pulse is shown as a decrease in 1% of the period length.

The falling edge of the immediately following pulse is then modulated to 51% of the carrier signal period. Since the previous falling edge was timed early, the total period length of this pulse is 102% of the carrier period, which is an increase by 3% from the previous modulated pulse. Thereafter, the following pulses are unmodulated until the next modulation event.

A Base Edge may be defined as the first rising edge following the lo-hi modulation event. This pulse has a 99% period length due to the late falling edge of the previous pulse. Depending on the particular implementation, the output clock Demod Clock may be timed to any one of the pulses following the Base Edge, for example, Sync Edge 0, Sync Edge 1, Sync Edge 2, etc. Selecting a later sync edge for timing of the output clock Demod Clock allows the demodulator additional time to detect the pulse, which may enable the demodulator 200 to synchronize the output clock Demod Clock to higher frequency reference clocks CLK than timing to earlier sync edges. In certain implementations, the sync edge may be selected by one or more sync edge control bits. The selection of the sync edge may also allow the system 100 designer to adjust the latency of the output clock Demod Clock.

The modulation event 310 of FIG. 3B illustrates a high-to-low (also referred to as hi-lo) modulation event. In this example, the period of the first pulse in the modulation event is increased to 101% of the carrier clock period while the second pulse in the modulation event is decreased to 99% of the carrier clock period. The differences between successive pulses surrounding the modulation event is shown in FIG. 3B and includes an increase by 1%, a decrease by 3%, an increase by 3%, and a final decrease by 1%.

The modulation event 315 of FIG. 3C illustrates an unbalanced, single pulse modulation event. In this example, the period of the modulated pulse is decreased to 99% of the carrier clock period. The differences between successive pulses surrounding the modulation event is shown in FIG. 3C and includes a decrease by 1%, an increase by 2%, and a final decrease by 1%.

The modulation event 320 of FIG. 3D illustrates an unbalanced, single pulse modulation event. In this example, the period of the modulated pulse is increased to 101% of the carrier clock period. The differences between successive pulses surrounding the modulation event is shown in FIG. 3D and includes an increase by 1%, a decrease by 2%, and a final increase by 1%.

Figure 4:
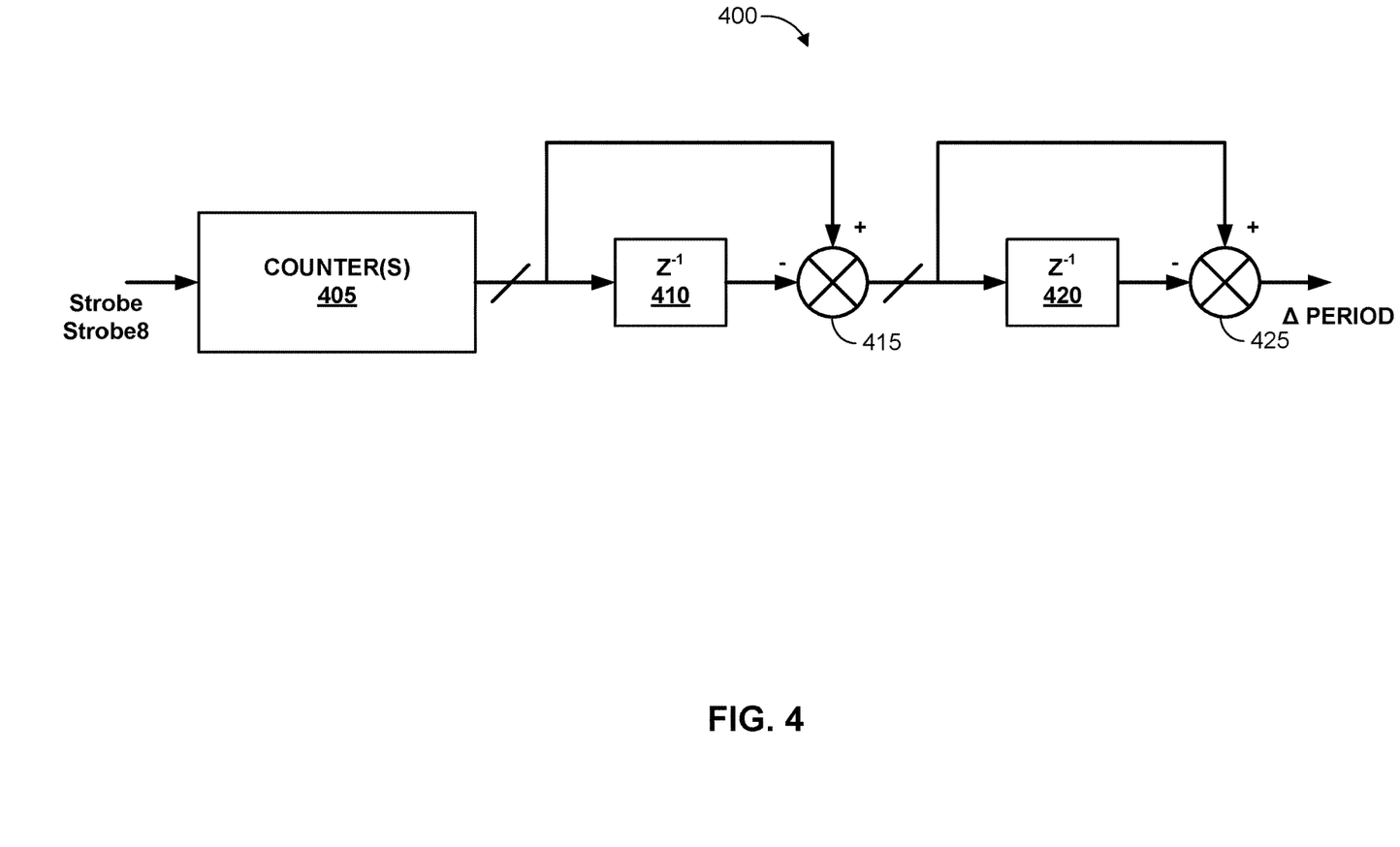
FIG. 4 is a block diagram illustrating one embodiment of counters and a timestamp generator and period calculator in accordance with aspects of this disclosure.

FIG. 4 is a block diagram illustrating one embodiment of counters and a timestamp generator and period calculator in accordance with aspects of this disclosure. The circuit 400 of FIG. 4 includes one or more counter(s) 405, and two differentiators including of two unit delays 410 and 420, and two subtractors 415 and 425 respectively. The counter(s) 405 may be embodied by the high and low resolution counters 215 and 220 illustrated in FIG. 2, and thus, may output timestamps indicative of falling edge transitions in the reference clock REFCLK based on the first and second strobe signals Strobe and Strobe8. The timestamps are supplied to the unit delay 410 and the subtractor 415. The differentiator delays the timestamp (e.g., for one strobe period, see FIG. 2), and thus, the subtractor 415 determines the difference between the current timestamp and the previous timestamp, which is indicative of the period of a given pulse. The calculated period is supplied to the second differentiator with unit delay 420 and the subtractor 425. The subtractor 425 determines the difference between the current period and the previous period, which is indicative of the difference between two successive periods ΔPERIOD.

Figure 5:
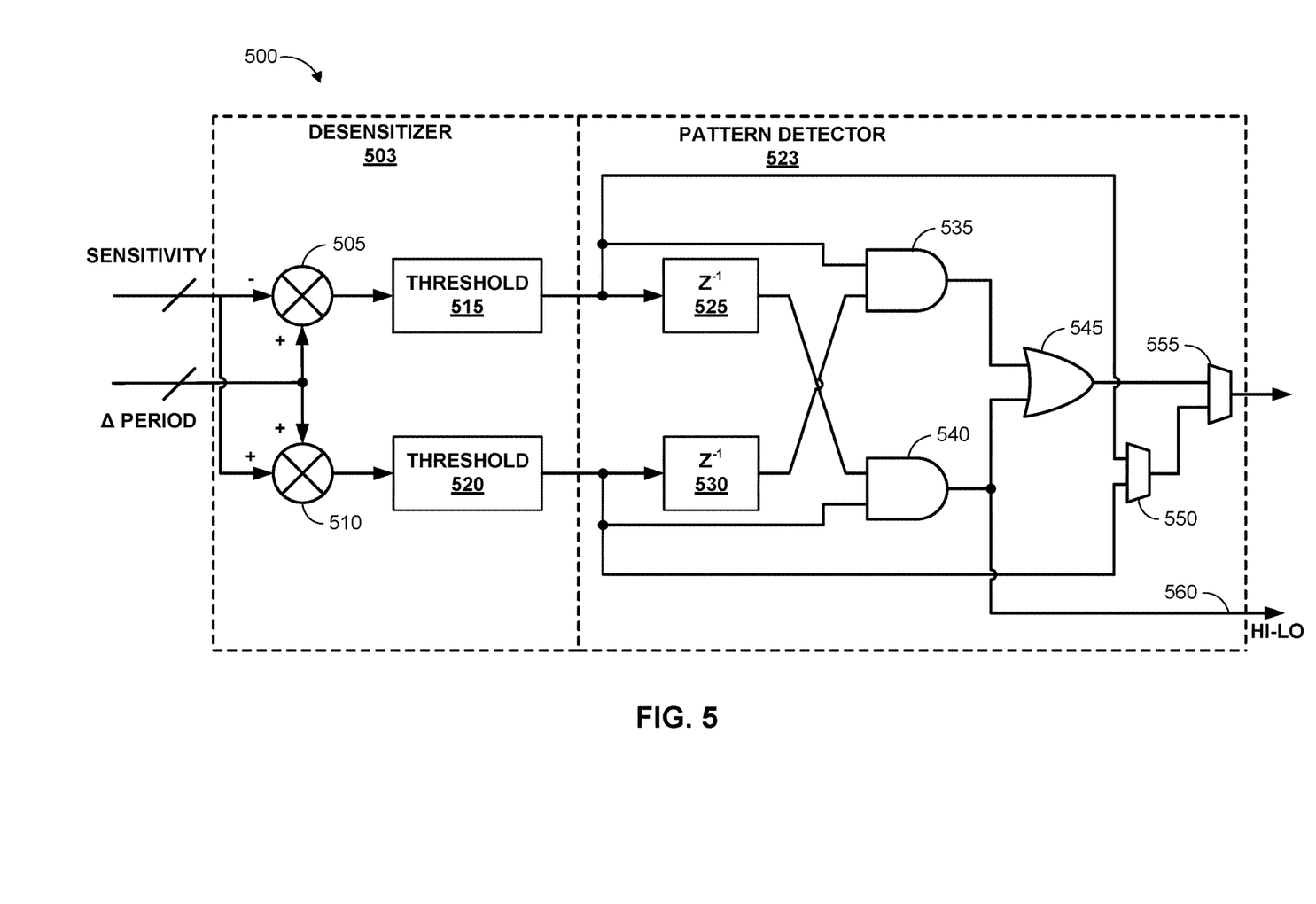
FIG. 5 is a block diagram illustrating one embodiment of a desensitizer and a pattern detector in accordance with aspects of this disclosure.

FIG. 5 is a block diagram illustrating one embodiment of a desensitizer and a pattern detector in accordance with aspects of this disclosure. The circuit 500 of FIG. 5 may be a portion of a circuit implementing the modulation event detector 230 of FIG. 2. The circuit 500 includes a desensitizer 503 and a pattern detector 523. The desensitizer receives the period difference value indicative of the difference between two successive periods ΔPERIOD from the circuit 400 and receives a sensitivity value, which may be selected by the system designer using one more ore sensitivity control bits. The desensitizer 503 includes two adders 505 and 510 configured as a subtractor and a summer respectively, and two threshold circuits 515 and 520. The adders 505 and 510 bias the period difference value ΔPERIOD by the sensitivity value to reduce the sensitivity of the modulation event detector 230 to noise and/or sampling errors. The desensitized period difference values ΔPERIOD are compared to threshold values in each of threshold circuits 515 and 520. In one example, threshold circuit 515 determines whether the desensitized period difference value ΔPERIOD is greater than zero (e.g., is indicative of a hi period where the modulated pulse has a period greater than the carrier period length). Similarly, threshold circuit 520 may determine whether the desensitized period difference value ΔPERIOD is less than zero (e.g., is indicative of a lo period where the modulated pulse has a period less than the carrier period length). Accordingly, the output of threshold circuit 515 may detect hi periods and the output of threshold circuit 520 may detect lo periods.

Pattern detector 523 may detect patterns representative of a modulation event. In the embodiment of FIG. 5, the pattern detector 523 includes two unit delays 525 and 530, two AND gates 535 and 540, an OR gate 545, and two multiplexors 550 and 555. Since threshold circuit 515 detect hi periods and threshold circuit 520 detects lo periods, the output of AND gate 535 is indicative of a lo-hi period transition (e.g., the previous period was lo as delayed by unit delay 530 and the current period is high as indicated by the output of threshold circuit 515). Similarly, the output of AND circuit 540 is indicative of a hi-lo period transition based on the outputs of threshold circuit 520 and unit delay 525. By selecting which inputs to output from multiplexor 550, the pattern detector can detect one of: lo period transitions, or hi period transitions. By selecting which inputs to output from multiplexor 555, the pattern detector can detect either lo-hi or hi-lo period transitions and provide the output retiming circuit 700 with a signal 560 indicating the polarity of period transition detected (lo-hi or hi-lo).

Figure 6:
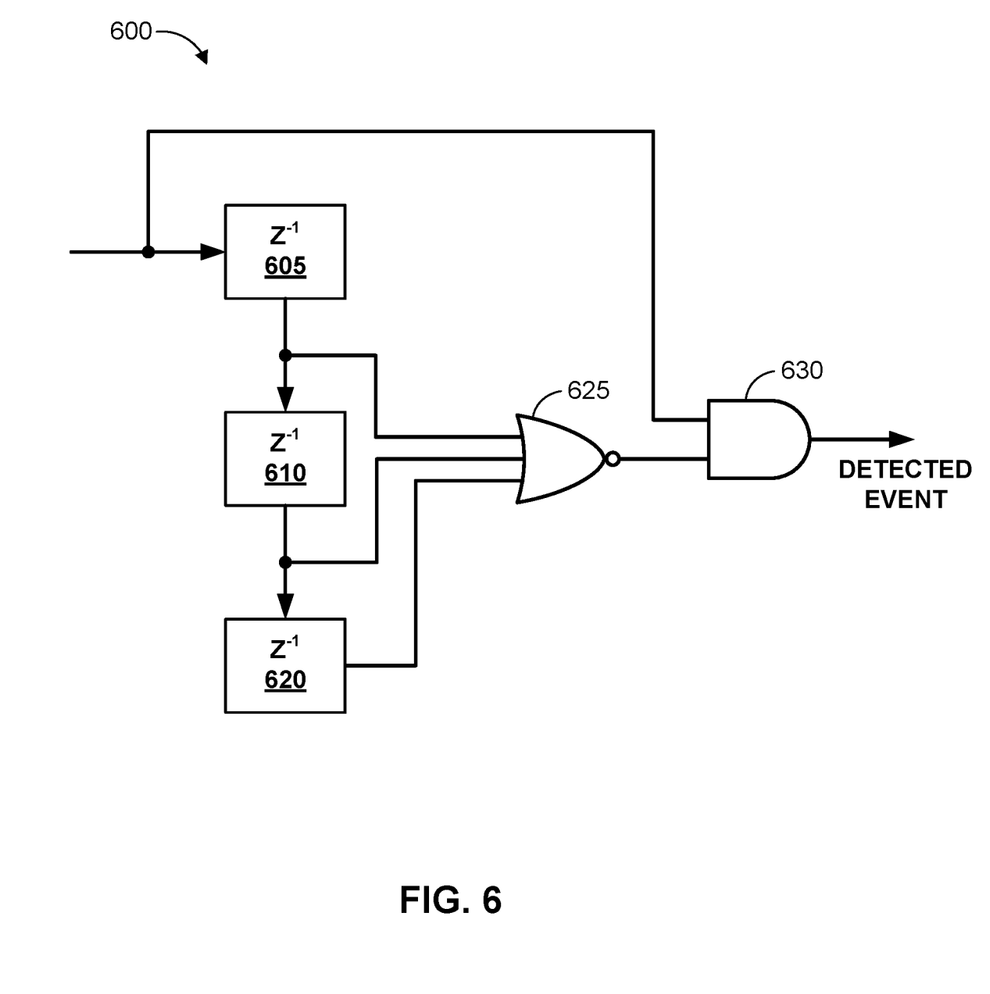
FIG. 6 is a block diagram illustrating one embodiment of an event masking circuit in accordance with aspects of this disclosure.

FIG. 6 is a block diagram illustrating one embodiment of an event masking circuit in accordance with aspects of this disclosure. The event masking circuit 600 may be included as part of the modulation event detector 230 illustrated in FIG. 2. The event masking circuit 600 includes three unit delays 605, 610, and 620, a NOR gate 625, and an AND gate 630. The event masking circuit receives the output of the pattern detector 523. The event masking circuit 600 may be configured to mask the signal received from the edge detector 210 (e.g., the output received from the pattern detector 523) for at least one period of the reference clock REFCLK immediately following the identification of the modulation event.

In the illustrated embodiment, the event masking circuit masks the output of the pattern detector 523 for three strobe cycles. That is, since each of the unit delays 605, 610, and 620 delays the received output of the pattern detector 523, the output from the NOR gate 625 will be low for three strobe periods after the detection of an event by pattern detector 523. Thus, the output of the event masking circuit 600 will be low for three strobe periods after the pattern detector first detects an event. Accordingly, masking of the output received from the pattern detector 523 may include rejecting any identified pulse width modulated pulses occurring within the at least one period of the reference clock REFCLK immediately following the identification of the at least one pulse-width modulated pulse. When an event has not been detected for the previous three periods and the output of pattern detector is indicative of a detected event, the output of event masking circuit 600 will be indicative of a detected event. By changing the number of unit delays in event masking circuit 600, the number of masked events can be changed.

Figure 7:
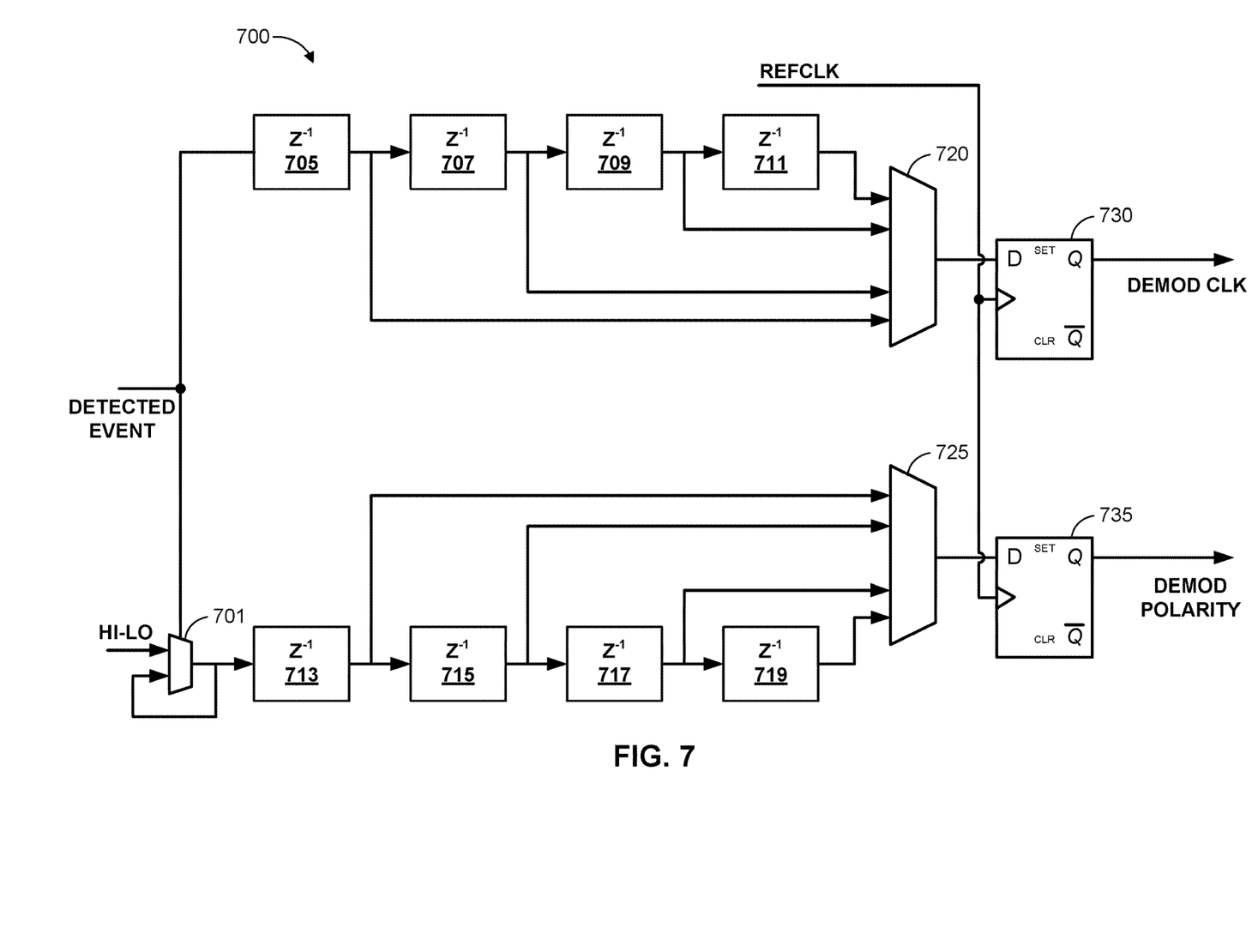
FIG. 7 is a block diagram illustrating one embodiment of an output re-timing and latency selection circuit in accordance with aspects of this disclosure.

FIG. 7 is a block diagram illustrating one embodiment of an output re-timing and latency selection circuit in accordance with aspects of this disclosure. For example, the circuit 700 of FIG. 7 may be one embodiment of the output re-timing and latency selection circuit 240 of FIG. 2. The circuit 700 may include eight unit delays 705 to 719, three multiplexors 701, 720, and 725 and two D flip-flops 730 and 735. The circuit 700 may receive the detected event output from the event masking circuit 600 and a hi-lo transition output 560 from the pattern detector 523.

The circuit 700 of FIG. 7 includes two chains of unit delays 705 to 711 and 713 to 719 which can be used to select the latency at which the output clock DEMOD CLK is retimed. The top chain of unit delays 705 to 711 delays the detected event signal received from the event masking circuit 600. The bottom chain of unit delays 713 to 719 delays the demodulation polarity signal 560 received from the multiplexor 701.

The multiplexor 701 may be configured as a latch whose output is updated on every detected event. The input signal 560 supplied to the multiplexor 701 indicates whether the detected event was created from two consecutive pulses transition from a low to high duty-cycle or transition from a high to low duty-cycle and the multiplexor 701 outputs a demodulation polarity signal indicative of the type of transition. For example, the multiplexor 701 selects the previous value output from the multiplexor 701 when no event is detected by event masking circuit 600 and selects the hi-lo transition output from the pattern detector 523 when an event is detected by event masking circuit 600. The demodulation polarity signal detected by the multiplexor 701 may be used to transmit data between the reference clock generator 105 and the IC chip 110 or 115. For example, by adjusting the polarity of the modulation event, digital data can be transmitted, which can be read based on the value of the demodulation polarity DEMOD POLARITY.

By selecting the delay to be applied to each of the detected event value and the demodulation polarity value, the modulators 720 and 725 can select one of Sync Edge 0, Sync Edge 1, and Sync Edge 2 (see FIGS. 3A-3D) for retiming of the output clock DEMOD CLK. Since modulation detection is performed using the low frequency sampling clock CLK8, which is asynchronous with other IC chips, the output clock DEMOD CLK is retimed to a rising edge of the reference clock REFCLK via D flip-flop 730. Thus, the re-timing and latency selection circuit 240 may be configured to generate the output clock DEMOD CLK to be synchronized with a rising edge of the reference clock REFCLK. Similarly, the demodulation polarity DEMOD POLARITY determined by the multiplexor 701 is retimed to the reference clock REFCLK by the D flip flop 735.

Figure 8:
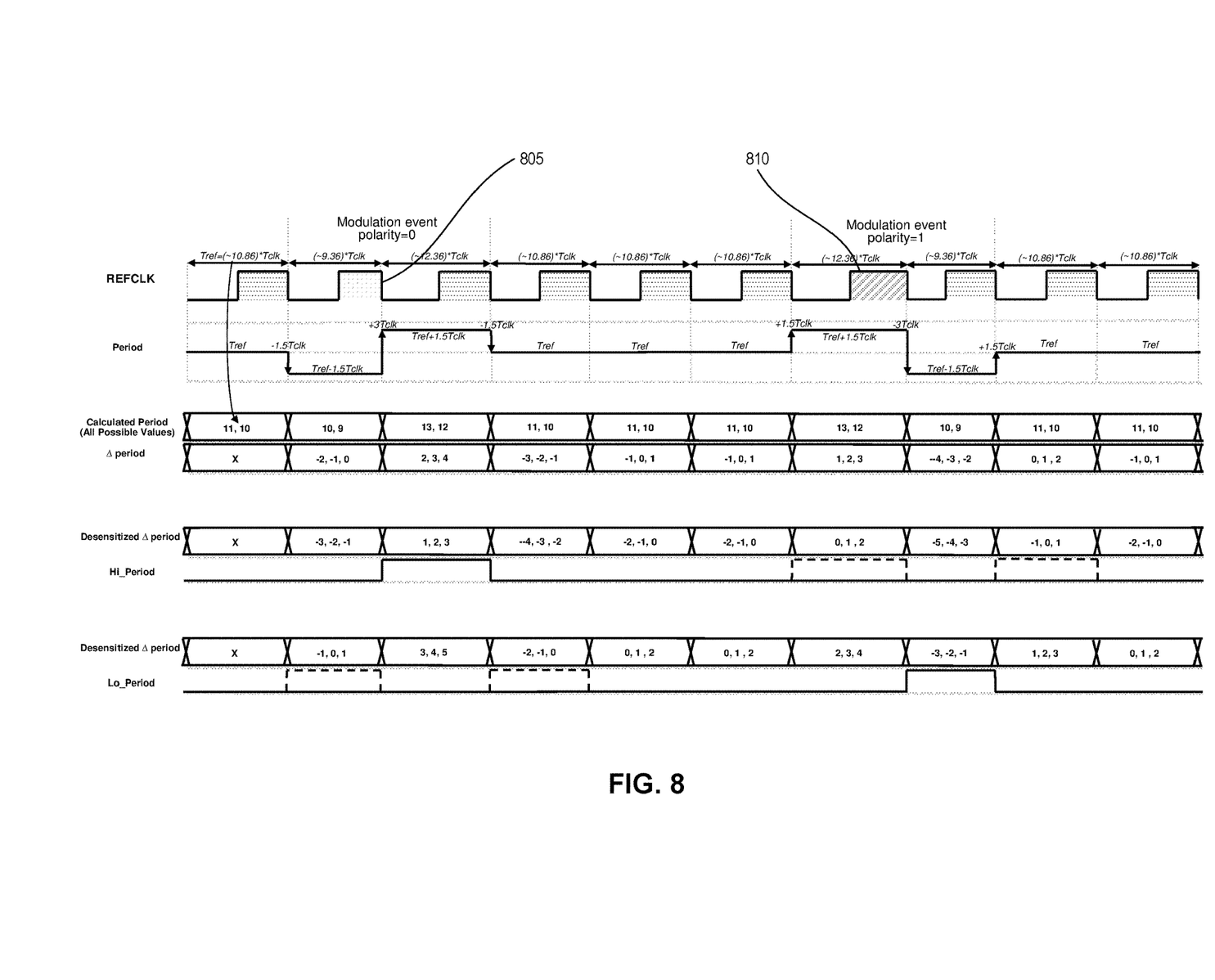
FIG. 8 provides an example of a reference clock and illustrates sources of potential sampling errors along with techniques for rejecting potential errors in accordance with aspects of this disclosure.

FIG. 8 provides an example of a reference clock and illustrates sources of potential sampling errors along with techniques for rejecting potential errors in accordance with aspects of this disclosure. In the example of FIG. 8, the sampling ratio between the frequency of the sampling clock CLK and the frequency of the reference clock REFCLK is about 10.86. Thus, quantization error is introduced since the sampling clock CLK is not an integer multiple of the reference clock REFCLK. In this example, an unmodulated pulse in the reference clock REFCLK could be sampled as having a period of either 10 or 11 cycles of the sampling clock CLK.

The top two lines of FIG. 8 illustrate an example reference clock REFCLK including two unbalanced modulation events, a polarity 0 modulation event 805 and a polarity 1 modulation event 810. The next two lines provide the theoretical period values that may be detected due to quantization error in the sampling of the reference clock REFCLK and the theoretical values that could be calculated as the period difference value ΔPERIOD based on the measured period values.

The next two lines represent the desensitized period value calculated by subtractor 505 (e.g., indicative of a hi period) and whether a hi period is detected by pattern detector 523. The last two lines represent the desensitized period value calculated by summer 510 (e.g., indicative of a lo period) and whether a lo period is detected by pattern detector 523.

The embodiment of FIG. 8 includes a desensitization of one, and thus, the potential difference value ΔPERIOD is reduced by one for hi period detection and is increased by one for lo period detection. Further, the polarity 0 modulation event 805 is always detected by threshold circuit 515 since the possible values for difference value ΔPERIOD are 1, 2, and 3 (e.g., they are all greater than 0). However, false hi period detection events may be possible for the polarity 1 modulation event 810 since possible values of 0, 1, and 2 prior to the modulation event and possible values of −1, 0, and 1 may be detected, depending on the quantization error introduced near the polarity 1 modulation event 810.

Similarly, the polarity 1 modulation event 810 is always detected by threshold circuit 520 since the possible values for difference value ΔPERIOD are −3, −2, and −1 (e.g., they are all less than 0). However, false lo period detection events may be possible for the polarity 0 modulation event 805 since possible values of −1, 0, and 1 prior to the modulation event and possible values of −2, −1, and 0 may be detected, depending on the quantization error introduced near the polarity 0 modulation event 805. Proper selection of the desensitization value, the amount of modulation applied to the reference clock REFCLK, and the frequencies of the reference clock REFCLK and the sampling clock CLK may reduce the chance of or eliminate false event detection due to quantization error.

There are other sources of error which may be important to consider in selecting desensitization and masking. For example, jitter errors may be introduced when the ratio between the reference clock REFCLK and sampling clock CLK is very close to an integer value. For example, when the transitions in the reference clock REFCLK nearly match those in the sampling clock CLK, slight variations in the timing of the transitions due to noise may affect the sampled period of the reference clock REFCLK. Thus, the measured period for unmodulated pulses may fluctuate between two values (e.g., 9 and 10) when noise affecting the timing of transitions in one of the sampling clock CLK and the reference clock REFCLK exchanges the relative timing in transitions for a number of consecutive pulses. One way of addressing jitter errors is to increase the level of desensitization.

Although various features and components have been described in terms of certain embodiments, other embodiments that are apparent to those of ordinary skill in the art, including embodiments that do not provide all of the features and advantages set forth herein, are also within the scope of the disclosure. Moreover, the various embodiments described above can be combined to provide further embodiments. In addition, certain features shown in the context of one embodiment can be incorporated into other embodiments as well. Accordingly, the scope of the disclosure is defined only by reference to the appended claims.

Furthermore, as used in the claims, language such as the phrase "at least one of X, Y and Z," and/or "at least one of X, Y or Z," are understood to convey that an item, term, recitation, claim element, etc. may be any of X, Y, or Z, or any combination thereof (non-limiting examples: XY, XZ, YZ, XYZ, etc.). Thus, such language is not generally intended to imply that certain embodiments require at least one of X, at least one of Y and at least one of Z to each be present or to require only one of: X or Y or Z, to the exclusion of others.

Moreover, the foregoing description and claims can refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components can be present in an actual embodiment (assuming that the functionality of the depicted circuits is not adversely affected).

What is claimed is:

1. A clock demodulation circuit for synchronizing a clock signal with a reference clock, the demodulation circuit comprising:
   an edge detector configured to detect transitions in a reference clock and output a signal in response to a detected transition;

a modulation detection circuit configured to identify at least one pulse-width modulated pulse that is different from a plurality of pulses of the reference clock based at least in part on the signal; and a retiming circuit configured to output a clock signal synchronized with a synchronization transition in the reference clock, wherein the synchronization transition corresponds to the identified at least one pulse-width modulated pulse.

2. The demodulation circuit of claim 1, further comprising:

a sampling clock input configured to receive a sampling clock, the sampling clock having a higher frequency than the reference clock, wherein the edge detector is further configured to oversample the reference clock at a rate defined by the sampling clock.

3. The demodulation circuit of claim 2, wherein the sampling clock and the reference clock are asynchronous.

4. The demodulation circuit of claim 1, wherein the synchronization transition comprises a rising edge of the reference clock.

5. The demodulation circuit of claim 1, wherein the modulation detection circuit is further configured to mask the signal received from the edge detector for at least one period of the reference clock immediately following the identification of the at least one pulse-width modulated pulse.

6. The demodulation circuit of claim 5, wherein masking the signal comprises rejecting any identified pulse-width modulated pulses occurring within the at least one period of the reference clock immediately following the identification of the at least one pulse-width modulated pulse.

7. The demodulation circuit of claim 1, wherein the at least one pulse-width modulated pulse comprises two consecutive pulse-width modulated pulses, one of the two consecutive pulse-width modulated pulses having a duty-cycle that is lower than other pulses of the plurality of pulses and the other of the two consecutive modulated pulses having a duty-cycle that is higher than the other pulses of the plurality of pulses.

8. The demodulation circuit of claim 7, wherein the two consecutive pulse-width modulated pulses are direct current (DC) balanced.

9. The demodulation circuit of claim 8, wherein the modulation detection circuit is further configured to detect whether the two consecutive pulse-width modulated pulses transition from a lower to higher duty-cycle or transition from a higher to lower duty-cycle and output a demodulation polarity signal indicative of whether the two consecutive pulses transition from the lower to higher duty-cycle or transition from the higher to lower duty-cycle.

10. The demodulation circuit of claim 9, wherein the modulation detection circuit is further configured to use the demodulation polarity signal for the transmission of data.

11. The demodulation circuit of claim 1, wherein the at least one pulse-width modulated pulse comprises a single pulse-width modulated pulse having one of a duty-cycle that is lower than other pulses of the plurality of pulses or a duty-cycle that is higher than the other pulses of the plurality of pulses.

12. The demodulation circuit of claim 11, wherein the modulation detection circuit is further configured to detect whether the single pulse-width modulated pulse has the duty-cycle that is lower than the other pulses or the duty-cycle that is higher than the other pulses and output a demodulation polarity signal indicative of whether the single pulse-width modulated pulse has the duty-cycle that is lower than the other pulses or the duty-cycle that is higher than the other pulses.

13. The demodulation circuit of claim 1, further comprising a period comparison circuit configured to:

compare consecutive periods from three successive clock edges in the reference clock based on the signal output from the edge detector, and output a signal indicative of the difference in the consecutive periods between the successive clock edges.

14. The demodulation circuit of claim 13, further comprising a desensitization circuit configured to:

receive the signal output from the period comparison circuit, reduce the difference in the consecutive periods by a defined value, and output a signal indicative of the reduced difference in the consecutive periods to the modulation detection circuit.

15. The demodulation circuit of claim 1, further comprising:

a modulation counter configured to:
 receive the clock signal from the retiming circuit,
 receive the reference clock, and
 output a secondary clock signal based on the clock signal and the reference clock; and a multiplexor configured to select one of the clock signal generated by the retiming circuit and the secondary clock signal as an output of the demodulation circuit.

16. A system for synchronizing clock signals between a plurality of circuits, comprising:

a reference clock generator configured to generate a reference clock;

a plurality of circuits, each circuit comprising a demodulation circuit, each demodulation circuit comprising:

an edge detector configured to detect transitions in the reference clock and output a signal in response to a detected transition;

a modulation detection circuit configured to identify at least one pulse-width modulated pulse that is different from a plurality of pulses of the reference clock based at least in part on the signal; and a retiming circuit configured to output a clock signal synchronized with a synchronization transition in the reference clock, wherein the synchronization transition corresponds to the identified at least one pulse-width modulated pulse.

17. The system of claim 16, wherein each of the demodulation circuits further comprises:

a sampling clock input configured to receive a sampling clock, the sampling clock having a higher frequency than the reference clock, wherein the edge detector is further configured to oversample the reference clock at a rate defined by the sampling clock.

18. The system of claim 16, wherein the retiming circuit of each of the demodulation circuits is further configured to output the clock signal to be synchronized with a rising edge of the reference clock.

19. A method of demodulating a reference clock, comprising:

detecting transitions in a reference clock and outputting a signal in response to a detected transition;

identifying at least one pulse-width modulated pulse that is different from a plurality of pulses of the reference clock based at least in part on the signal; and outputting a clock signal synchronized with a synchronization transition in the reference clock, wherein the synchronization transition corresponds to the identified at least one pulse-width modulated pulse.

20. The method of claim 18, further comprising:

receiving a sampling clock, the sampling clock having a higher frequency than the reference clock; and oversampling the reference clock at a rate defined by the sampling clock.

* * * * *